United States Patent
Busardo et al.

(10) Patent No.: US 10,923,310 B2
(45) Date of Patent: Feb. 16, 2021

(54) ION BEAM TREATMENT PROCESS FOR PRODUCING A SCRATCH-RESISTANT HIGH-TRANSMITTANCE ANTIREFLECTIVE SAPPHIRE

(71) Applicant: IONICS FRANCE, Hérouville-Saint-Clair (FR)

(72) Inventors: Denis Busardo, Gonneville-sur-Mer (FR); Frédéric Guernalec, Liffre (FR)

(73) Assignee: IONICS FRANCE, Hérouville-Saint-Clair (FR)

(*) Notice: Subject to any disclaimer, the term of this patent is extended or adjusted under 35 U.S.C. 154(b) by 0 days.

(21) Appl. No.: 16/485,084

(22) PCT Filed: Feb. 12, 2018

(86) PCT No.: PCT/FR2018/050332
§ 371 (c)(1),
(2) Date: Aug. 9, 2019

(87) PCT Pub. No.: WO2018/150130
PCT Pub. Date: Aug. 23, 2018

(65) Prior Publication Data
US 2020/0043694 A1 Feb. 6, 2020

(30) Foreign Application Priority Data
Feb. 14, 2017 (FR) .................... FR1770134

(51) Int. Cl.
*H01J 37/08* (2006.01)
*G02B 1/113* (2015.01)
(Continued)

(52) U.S. Cl.
CPC .............. *H01J 37/08* (2013.01); *G02B 1/113* (2013.01); *H01J 37/3171* (2013.01); *G06F 3/041* (2013.01)

(58) Field of Classification Search
CPC ......... C23C 14/48; C30B 29/20; C30B 31/22; G02B 1/02; G02B 1/11; G02B 1/12; H01J 2237/31701
(Continued)

(56) References Cited

U.S. PATENT DOCUMENTS

2006/0060796 A1* 3/2006 Subramanian .......... H01J 37/08
250/492.21
2011/0053345 A1* 3/2011 Hanaoka ........... H01L 21/30604
438/458
(Continued)

FOREIGN PATENT DOCUMENTS

FR 3027120 A1 4/2016
WO WO-2015/176850 A1 11/2015
WO WO-2015176850 A1 * 11/2015 ............... G02B 1/02

OTHER PUBLICATIONS

International Search Report, corresponding International Application No. PCT/FR2018/050332, dated May 30, 2018.
(Continued)

*Primary Examiner* — David A Vanore
(74) *Attorney, Agent, or Firm* — Marshall, Gerstein & Borun LLP

(57) ABSTRACT

Process for treatment of a sapphire part with a beam of a mixture of mono- and multicharged ions of a gas which are produced by an electron cyclotron resonance (ECR) source, where:
the voltage for acceleration of the ions is between 10 kV and 100 kV;
the implanted dose, expressed in ions/cm², is between $(5\times10^{16})\times(M/14)^{-1/2}$ and $10^{17}\times(M/14)^{-1/2}$, where M is the atomic mass of the ion;
the rate of displacement $V_D$, expressed in cm/s, is between $0.025\times(P/D)$ and $0.1\times(P/D)$, where P is the power of the beam, expressed in W (watts), and D is the diameter of the beam, expressed in cm (centimetres).
(Continued)

A part made of sapphire having a high transmittance and which is resistant to scratching is thus advantageously obtained.

16 Claims, 1 Drawing Sheet

(51) Int. Cl.
*H01J 37/317* (2006.01)
*G06F 3/041* (2006.01)

(58) Field of Classification Search
USPC .................................. 250/492.21; 427/523
See application file for complete search history.

(56) References Cited

U.S. PATENT DOCUMENTS

2014/0248472 A1* 9/2014 Memering .............. C30B 29/20
428/192
2017/0334775 A1* 11/2017 Navet ................. C03C 23/0055

OTHER PUBLICATIONS

Written Opinion of the International Searching Authority, corresponding to International Application No. PCT/FR2018/050332, dated May 23, 2019.

\* cited by examiner

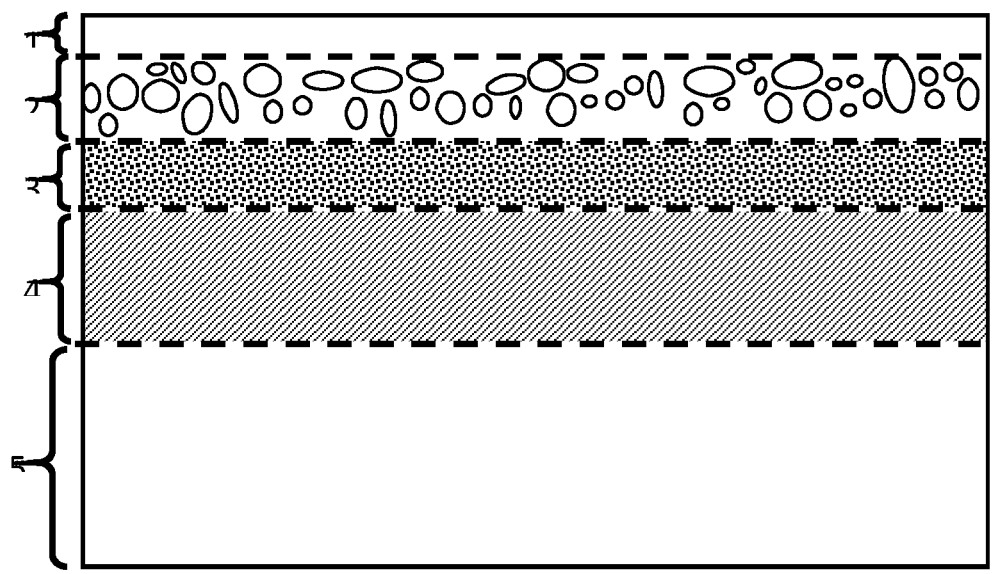

ION BEAM TREATMENT PROCESS FOR PRODUCING A SCRATCH-RESISTANT HIGH-TRANSMITTANCE ANTIREFLECTIVE SAPPHIRE

CROSS-REFERENCE TO RELATED APPLICATIONS

This application is a U.S. National stage of International Patent Application No. PCT/FR2018/050332 filed Feb. 12, 2018, which claims the benefit of priority of French Patent Application No. 17 70134 filed Feb. 14, 2017, the respective disclosures of which are each incorporated herein by reference in their entireties.

BACKGROUND

Field of the Disclousure

It is an object of the invention to treat a sapphire part by ion implantation, in order to obtain a scratch-resistant high-transmittance antireflective (AR) treatment. Sapphire is understood to mean a material comprising at least 98% by weight of aluminium oxide, such as, for example, at least 99% by weight of aluminium oxide, such as, for example, at least 99.9% by weight of aluminium oxide.

A sapphire material can be composed of one or more corundum monocrystals. Its nature can thus be polycrystalline. According to one embodiment of the present invention, a sapphire material is a monocrystalline corundum part. Typically, the substrates made of sapphire material of the present invention are provided, depending on the applications targeted, in the form of a flat sheet or in the form of more or less rounded and more or less bent discs, for watches and lenses, for example. Without this involving any limitation on the present invention, the thicknesses of the substrates treated generally do not exceed 2 mm.

A sapphire material can be natural or synthetic; according to one embodiment, a sapphire material of the present invention is a synthetic sapphire material. In that which follows, high-transmittance antireflective treatment will be understood as meaning an antireflective treatment (AR treatment) for which the transmittance of a substrate made of sapphire is increased from 86%, measured at a wavelength of 530 nm, to a transmittance of greater than or equal to 91% for a treatment on just one face of the material and of greater than or equal to 96% for a treatment on both faces. This is expressed, for a sapphire part, by a treatment applied to one of the two faces of the latter, so that the reflectance Y (%) of the treated face becomes less than or equal to 9% at a wavelength of 530 nm. In that which follows, reflectance Y, expressed in %, will be understood as meaning the reflectance measured at a wavelength of 530 nm, measured on the treated face. Above a transmittance of 96%, in other words for Y≤9%, on a typical substrate made of sapphire, it is in fact commonly accepted that the human eye notices differences in transmittance (for example between a transmittance of 97.5% and 98.5%) with great difficulty.

In the context of the present invention, scratch resistance is understood to mean the ability of a material made of sapphire, which has been subjected to an antireflective treatment, to withstand the formation of scratches during the use thereof. Thus, for example, a touch screen is subjected to repeated rubbing actions when it is taken out of and put back into a pocket, an optical lens during the cleaning thereof and a watch glass in permanent contact with a turned-back cuff. There exists a simple means for evaluating this scratch resistance based on the Mohs hardness scale. As this is an ordinal scale, it is necessary to proceed by comparison (ability of one material to scratch the other under a low load) with a material, the hardness of which is already known. This scale is neither linear nor logarithmic. The scale is given below (see Tab. 1).

BRIEF DESCRIPTION OF RELATED TECHNOLOGY

There are antireflective coatings obtained by cathode sputtering, often magnetron-assisted cathode sputtering, on materials made of sapphire (AR PVD) which achieve a Mohs hardness substantially close to, indeed even equal to, 7 Mohs, 7 Mohs, a hardness comparable to, indeed even greater than, that of quartz, often being regarded as the minimum acceptable in many applications, in particular in watchmaking( ). These AR PVDs also achieve high transmittances but this process requires very precise control of the deposition of numerous thin layers of different materials, which is complicated and expensive.

TABLE 1

| Hardness | Material |
| --- | --- |
| 1 | Talc, crumbly under a fingernail |
| 2 | Gypsum, scratchable with a fingernail |
| 3 | Calcite, scratchable with a part made of copper |
| 4 | Fluorite, scratchable (easily) with a knife |
| 5 | Apatite, scratchable with a knife |
| 6 | Orthoclase, scratchable with a file, with sand |
| 7 | Quartz, scratches glass |
| 8 | Topaz, scratchable with tungsten carbide |
| 9 | Corundum (sapphire), scratchable with silicon carbide |
| 10 | Diamond, scratchable with another diamond |

Another method which is suitable for evaluating the scratchability of treated materials made of sapphire is the progressive load scratch test (PLST), which corresponds to the application of a continuous and gradual load during the displacement of the sample under an indenter.

Patent WO 2015176850 A1, "Single- and/or multi-charged gas ion beam treatment method for producing an anti-glare sapphire material", filed by the inventors, describes the conditions for the AR treatment of a sapphire by ion implantation which makes it possible to achieve, for a two-faced treatment, very high transmittances which can reach 99.5% (i.e. a gain of more or less 14% on comparing them with the reference transmittances of a crude sapphire equal to 85.6% for reference sapphire glass).

Complementary tests of hardness of Mohs type carried out by the inventors with regard to this AR treatment obtained by ion implantation have made it possible to reveal that there existed a narrow dose range (located between 5.5 and $8.5 \times 10^{16}$ ions/cm$^2$), in which the increase in the transmittance was accompanied by a very rapid reduction in the Mohs hardness and in the abrasion resistance which is associated with it.

BRIEF DESCRIPTION OF THE DRAWINGS

FIG. 1 is a schematic illustration of the structure of an AR treatment obtained according to the process of the invention.

DETAILED DESCRIPTION

The inventors give below a table (Tab. 2) in which the experimental results which have allowed them to exactly identify this narrow correlation between the reflectance Y of the treated face and the Mohs hardness of the treated face, according to a dose of nitrogen ions which are implanted at an acceleration voltage of 20 kV, are summarized. The Mohs hardness subsequent to the AR treatment was evaluated by using a ceramic knife calibrated in order to have a Mohs hardness of 7 and a fine edge with a width of approximately 20 μm. This ceramic knife is slid over the AR surface with a light load of 50 g and then the existence or not of scratch(es) observable with the naked eye is observed under low-angled light (80° with respect to the normal). In that which follows, when mention is made of Mohs hardness, reference is being made to this test protocol which has just been described. It should be remembered that the Mohs hardness of greater than or equal to 7 was selected by the invention as an acceptable hardness from the viewpoint of the AR PVD hardnesses substantially close to, indeed even equal to, 7 Mohs.

TABLE 2

| Acceleration voltage (kV) | Dose ($10^{16}$ ions/cm²) | Y % (at 530 nm) | Scratch under low-angled spotlight with ceramic knife Mohs 7 | Mohs hardness |
|---|---|---|---|---|
| 20 | 6.75 | 9.9 | no | >7 |
|    | 7.00 | 10.0 | no | >7 |
|    | 7.25 | 9.8 | no | >7 |
|    | 7.50 | 9.7 | limit | 7 |
|    | 7.75 | 9.6 | yes | <7 |
|    | 8.00 | 9.5 | yes | <7 |
|    | 8.25 | 9.6 | yes | <7 |
|    | 8.50 | 9.5 | yes | <7 |

It is found that, around the dose $7.50 \times 10^{16}$ ions/cm², the Mohs hardness rapidly swings, between $7.25 \times 10^{16}$ and $7.75 \times 10^{16}$ ions/cm², from >7 to <7 Mohs in the direction of the increasing doses and that the reflectance Y of a treated face always remains greater than 9%. A priori, it appears, in view of these results, that it is impossible to reconcile, for an AR treatment by ion implantation, a low reflectance value (Y less than or equal to 9%) and a sufficient Mohs hardness (preferably greater than or equal to 7).

At first sight, this technical difficulty in reconciling Mohs hardness of greater than or equal to 7 and reflectance Y of less than or equal to 9% in order to achieve a high transmittance handicaps, indeed even invalidates, the field of replacement of the process of the ion implantation with AR PVDs which are known to have reflectances Y<9% and Mohs hardnesses of approximately 7, if only for the external face of the sapphire part, subjected to the strongest operational stresses.

It is an aim of the invention to overcome the technical problems and disadvantages set out above.

The invention provides a process for AR treatment by ion implantation for a part made of sapphire, characterized by a reflectance Y of the treated face of less than or equal to 9%, while retaining, on the said treated face, a hardness of greater than or equal to 7 Mohs.

The invention provides a process for AR treatment by ion implantation, characterized in that nanocavities are formed in the treated thickness and in that, for one and the same dose of implanted ions with one and the same acceleration voltage, the size of the nanocavities is controlled by adjusting the rate of displacement of the beam, in other words the local (in situ) and transitory thermal conditions during the passage of the beam. Nanocavities is the name of the pores, the size of which varies from a nm to a few tens of nm, that is to say between 1 nm and 100 nm.

The invention provides an AR treatment by ion implantation, characterized by the creation, in the treated thickness, of nanocavities with a size of less than or equal to a maximum size, in order to be able to respond to the optical (Y of less than or equal to 9%) and mechanical (hardness of greater than or equal to 7 Mohs) constraints targeted by the invention.

It is an aim of the invention to present a method for treatment of parts made of sapphire which is relatively inexpensive and which makes it possible to treat surfaces corresponding to the requirements of numerous applications. Mention will in particular be made, among these applications, of: touch screens, lenses of an optical device or watch glasses.

The part made of sapphire and the beam of a mixture of mono- and multicharged ions of a gas are displaced with respect to one another at a rate $V_D$. According to one embodiment, the part made of sapphire is displaced under the beam of a mixture of mono- and multicharged ions of a gas according to a plurality N of passes at the rate $V_D$. Each pass is characterized by a series of to-and-fro movements of given amplitudes, separated parallel to one another by an advance corresponding to a fraction of the diameter of the beam, in order to guarantee the homogeneity of the treatment. When the beam and kinematic parameters are fixed, the dose received, expressed in number of ions per unit of surface area, is proportional to the number of pass(es) carried out. However, the modes of displacement of the sapphire part, with respect to the beam of ions, may vary without departing from the spirit of the present invention.

The invention provides a process for AR treatment of a sapphire part, characterized in that it comprises a bombardment of the sapphire part with the beam of a mixture of mono- and multicharged ions of a gas which are produced by an electron cyclotron resonance (ECR) source, where:

The dose of mono- and multicharged ions of a gas which are implanted per unit of surface area is chosen within a range of between $10^{16}$ and $3 \times 10^{17}$ ions/cm².

The acceleration voltage is chosen within a range of between 10 kV and 100 kV.

The inventors were able to find that, depending on the power (<400 W) and the diameter (<100 mm) of the beam, the mechanical improvement occurred within a range of rate of displacement $V_D$ which is reduced, generally of between 5 cm/s and 0.1 cm/s, and that an optimization was therefore desirable. The process of the invention recommends, during a preliminary stage, the adjustment of the rate of displacement $V_D$ around a nominal value, the value of which depends on the diameter and on the power of the beam. The process of the invention provides an empirical formula (see below) which makes it possible to evaluate this nominal rate as a function of the power of the beam and of its diameter. The rate of displacement $V_D$ has to be adjusted around this nominal value, preferably within a rate range of between half of this nominal value and twice this nominal value, with the aim of reducing the size of the nanocavities and of responding to the optical (Y of less than or equal to 9%) and mechanical (Mohs hardness of greater than or equal to 7) constraints targeted by the invention. This adjustment of the rate of displacement $V_D$ has to be carried out while keeping the other parameters, namely the dose, the acceleration voltage, the beam diameter, the advance and the displacement amplitudes defining the treatment region, constant.

The displacement amplitudes are adjusted, during a preliminary stage, so as to suppress, as far as possible, the thermal memory relating to the to-and-fro movements of the beam over the sapphire part. A thermal memory would have the effect of introducing unacceptable optical and/or mechanical differences according to the location of the sapphire parts in the treatment region. In order to ascertain this, it is sufficient to place sapphire parts at the ends and in the middle of the treatment region delimited by the displacement amplitudes and to observe that there exist no noticeable (in particular by the human eye) optical and mechanical differences on these parts after treatment. If this is the case, it is possible to increase the displacement amplitudes of the beam and/or to momentarily halt the beam between each to-and-fro movement, in order to allow time for the parts made of sapphire to cool before a new pass of the beam. The process of the invention recommends choosing the displacement amplitude A of the beam, expressed in cm, so that $(P/A^2)>0.04$ W/cm², where P is the power of the beam, expressed in W (watts).

The advance is adjusted so as to guarantee the homogeneity of the treatment. Relative advance values of less than or equal to 20% of the beam diameter are generally taken. For example, for a relative advance of 15% and a beam diameter of 40 mm, the advance is equal to 6 mm. Important comment: if the amplitudes are not sufficiently great, an excessively small advance may induce a thermal memory as a result of a series of excessively numerous passes of the beam over the sapphire part. In order to alleviate this effect, it is advisable to increase the amplitude and/or to increase the advance while continuing to guarantee the homogeneity of the treatment.

The implantation of a mixture of mono- and multicharged ions of a gas makes it possible to distribute the ions over a greater depth than the implantation of ions carrying just one charge. According to one embodiment, the beam of a mixture of mono- and multicharged ions of a gas comprises 10% of multicharged ions or more than 10% of multicharged ions.

According to one embodiment, the mono- and multicharged ions of a gas of the beam of ions are selected from the ions of the elements of the list of the "noble" gases, consisting of helium (He), neon (Ne), argon (Ar), krypton (Kr) and xenon (Xe).

According to another embodiment, the mono- and multicharged ions of a gas of the beam of ions are selected from the ions of the gases of the list consisting of nitrogen ($N_2$) and oxygen ($O_2$).

The choice of the dose of mono- and multicharged ions of a gas per unit of surface area within the dose range according to the invention can result from a preliminary calibrating stage, where a sample made of sapphire is bombarded with one of the mono- and multicharged ions of a gas, for example from He, Ne, Ar, Kr, Xe, $N_2$ or $O_2$, in order to identify the desired reflectance Y. For a value of reflectance Y at 530 nm which is substantially between 9% and 7.2%, the inventors recommend, for extraction voltages of between 10 and 100 kV, doses of preferably between $5\times10^{16}$ and $10^{17}$ ions/cm² for nitrogen (N) and/or oxygen (O) ions. This dose range must be revised upwards for the helium (He) ions and downwards for the heavy argon, krypton and xenon ions, so as to take into account the free path of these ions in the sapphire part, longer for the light ions and shorter for the heavy ions. This dose range can be calculated in the following way: for an ion of atomic mass M, the dose range, expressed in ions/cm², is between $(5\times10^{16})\times(M/14)^{-1/2}$ and $10^{17}\times(M/14)^{-1/2}$ in order to have a reflectance Y located between 7.2% and 9% and to be able to adjust the rate of displacement $V_D$ so as to obtain a Mohs hardness of greater than or equal to 7.

By way of example:
For helium (M=4), the preferred dose range is between $9.35\times10^{16}$ and $1.87\times10^{17}$ ions/cm².
For nitrogen (M=14), the preferred dose range is between $5\times10^{16}$ and $10^{17}$ ions/cm².
For argon (M=40), the preferred dose range is between $3\times10^{16}$ and $6\times10^{16}$ ions/cm².

The nominal rate V of the beam for adjusting the rate of displacement $V_D$ can be deduced by the following experimental formula:

$$V=0.05\times(P/D), \text{ expressed in cm/s,}$$

where P is the power of the beam, expressed in W (watts). $P=U\times I$, where U is the acceleration voltage, expressed in kV (kilovolts), and I is the beam intensity, expressed in mA (milliamperes). D is the diameter of the beam, expressed in cm.

The preferred range of exploration of the rate of displacement $V_D$ is between half of this nominal rate and twice this nominal rate, i.e. a range of between $0.025*(P/D)$ and $0.1*(P/D)$. Above the greatest rate (equal to $0.1*(P/D)$), the mechanical strength is not sufficient to have a Mohs hardness of greater than or equal to 7; below the lowest rate (equal to $0.025*(P/D)$), the temperature damages the value of the transmittance.

By way of example, for a beam with a diameter of 8 cm, with an intensity of 6 mA and with an acceleration voltage equal to 27.5 kV, a nominal rate of approximately 1 cm/s is calculated by the formula of the process of the invention. For 8 mA at 27.5 kV, a nominal rate of 1.25 cm/s is found. Once this nominal rate is deduced, it is possible, for a treatment dose located within the preferred dose range (for example between $5\times10^{16}$ and $10^{17}$ ions/cm² for nitrogen), to adjust the rate of displacement $V_D$ (by increasing it or by reducing it) within a rate range of preferably between 0.625 cm/s and 2.5 cm/s for the purpose of obtaining a hardness of greater than or equal to 7 on the Mohs scale and a reflectance Y of less than or equal to 9%.

The results below illustrate the process of the invention under the following conditions: treatment with a beam of a mixture of mono- and multicharged nitrogen ions with a diameter of 40 mm, with an intensity equal to 1.5 mA, with a voltage of 25 kV and with an advance of 15%, according to three rates of displacement $V_D$, the first rate equal to 80 mm/s, very much greater than the nominal rate (equal to 0.5 cm/s), the second to 10 mm/s, close to the nominal rate, and finally the third equal to 0.5 cm/s, in other words equal to the nominal rate.

Results associated with parts made of sapphire treated on a work holder cooled with water at ambient temperature (approximately 20° C.) will be found in the description of the present invention. According to another embodiment of the invention, the parts made of sapphire can be treated on a work holder brought to a higher temperature, preferably not exceeding 150° C., provided that the rate of displacement $V_D$ is increased in order to prevent excessive heating of the parts made of sapphire during the treatment. This would have the effect of damaging the desired antireflective properties.

For all the examples, the substrate is a sapphire material with dimensions of 12 cm×6 cm and with a thickness of 1 mm. The antireflective treatment is carried out on just one/both face(s) of the substrate.

|  | Example 1 | Example 2 | Example 3 |
|---|---|---|---|
| Power (W) | 37.5 | 37.5 | 37.5 |
| Diameter of the beam | 40 mm | 40 mm | 40 mm |
| Dose ($\times 10^{16}$ ions/cm$^2$) | 8 | 8 | 8 |
| Rate $V_D$ (cm/s) | 8 | 1 | 0.5 |
| Mohs hardness | 6 | 7 | ≥7 |
| Y (%) at 530 nm | 8.92 | 8.51 | 8.27 |

A marked improvement in the mechanical behaviour is observed when the rate of displacement $V_D$ is reduced to the vicinity of the nominal rate, estimated at 0.5 cm/s: the Mohs hardness is equal to 6 for 80 mm/s and increases until 7 is reached for 10 mm/s, indeed even greater than 7 for a rate equal to the nominal rate.

It is also found that the dose $8\times 10^{16}$ ions/cm$^2$ with a rate of beam displacement varying between 0.5 and 1 cm/s corresponds to the criteria satisfying a high transmittance (Y≤9%) and a Mohs hardness of greater than or equal to 7.

TEM (Transmission Electron Microscopy) analyses of the treated thickness have made it possible to understand the differences in mechanical behaviour obtained by the process of the invention between the sample treated at 8 cm/s and that treated at 1 cm/s.

The distribution profile of the nitrogen in these two samples was determined by dynamic-mode SIMS (Secondary Ion Mass Spectrometry) profiling. The equipment used is a Cameca imsf-4 device. The sputtering conditions are: primary beam 5.5 keV Cs', current density 0.16 mA/cm$^2$, sputtered area 125×125 μm$^2$. The surface analysed has a diameter of 60 μm. The MCs$^+$ ions are detected, M being the element to be analysed. For each element M, the intensity of the MCs$^+$ signal as a function of the sputtering time is detected so that the variation in the concentration of each element monitored is obtained as a function of the sputtering time. The sputtering time scale can be converted into a depth scale, provided that the rate of sputtering is constant, and, in the context of the present invention, this is considered to be the case. The intensities of the ions detected are standardized with respect to the isotopic ratio of the element and to the intensity of the Cs$^+$ ion.

For each sample, the integral of the intensity ratio I(NCs$^+$)/I(AlCs$^+$) as a function of the depth is calculated. The relative values of the amount of nitrogen implanted are obtained by subtracting the value of the I(NCs$^+$)/I(AlCs$^+$) integral of an untreated sample from the value of the integral of the intensity ratio I(NCs$^+$)/I(AlCs$^+$) of a treated sample. The depth of implantation D of a treated sample is the depth at which the intensity ratio I(NCs$^+$)/I(AlCs$^+$) is equal to the reference value.

The specifications of the measurement of the size of the nanocavities: the structure below the surface of the treated samples is determined by Transmission Electron Microscopy (TEM). To this end, a cross section is produced in the surface of the sample using the FIB (Focused Ion Beam) technique. During the preparation, a thin conductive layer of carbon and a layer of Pt are deposited at the surface of the sample. The sections thus produced are polished by an ion beam and then analysed by transmission electron microscopy in Bright Field mode (BF TEM) and in High Angle Annular Dark Field mode (HAADF TEM) on a device having the FEI Tecnai Osiris trademark operating at 200 kV. The images thus obtained exhibit a porous structure and show cross sections through the nanocavities. These images are processed using the ImageJ software (developed by the National Institute of Health, USA). In the context of the present invention, the size of a nanocavity corresponds to the equivalent circular diameter of the cross section of this nanocavity represented on the image which is obtained by the method described above. The equivalent circular diameter of the cross section of a nanocavity, generally having an irregular shape, is the diameter of a two-dimensional disc having an area equivalent to the cross section of this nanocavity, as determined by this image processing method. The mean size of the nanocavities of a porous region is the arithmetic mean of the sizes of the nanocavities observed in this region. Porosity of a porous region refers to the percentage of the surface area of the cross section of this porous region which is occupied by pores, as evaluated by the image processing method described in detail above.

For the sample treated at 8 cm/s (Example 1), the implanted layer of the sapphire part comprises, starting from the surface of the part towards the inside of the part:
- a compact layer, that is to say devoid of porosity detectable by the method used, with a thickness of 7 nm;
- a porous amorphous layer with a thickness of 50 nm, with pores (nanocavities) having a mean size of 20 nm with a standard deviation of 6 nm around this mean; 50% of the pores have a size of less than 18 nm, 75% of the pores have a size of less than 24 nm; the porosity is 50%;
- a pore-free amorphous layer, that is to say devoid of porosity detectable by the method used, with a thickness of 30 nm; pores with a size of less than 3 nm are not detected by the method used;
- a layer having altered crystallinity with a thickness of 60 nm; such a layer is crystalline but its crystallinity is different from that of the sapphire before the treatment;
- unaltered sapphire.

The distribution profile of the nitrogen in this sample shows that the integral of the intensity ratio I(NCs$^+$)/I(AlCs$^+$) is 1.66+/−0.03.

For the sample treated at 1 cm/s (Example 2), the implanted layer (implanted under the conditions of the process of the invention) comprises, from the surface of the part towards the inside:
- a compact layer with a thickness of 7 to 10 nm;
- a porous amorphous layer with a thickness of 60 nm, with a porosity of 26% with pores (nanocavities) having a mean size equal to 11 nm and a standard deviation of 4 nm around this mean; 50% of the pores have a size of less than 10 nm, 75% of the pores have a size of less than 13 nm;
- an amorphous layer devoid of visible pores with a thickness of 20 nm;
- a layer having altered crystallinity with a thickness of 50 nm;
- unaltered sapphire.

The distribution profile of the nitrogen in this sample shows that the integral of the intensity ratio I(NCs$^+$)/I(AlCs$^+$) is 1.67+/−0.03.

The compact layer and the porous amorphous layer are very largely responsible for the properties of durability and of reflectance observed.

The thermal conditions induced by virtue of the conditions of the process of the invention at a rate of displacement $V_D$ of 10 mm/s make it possible to create pores (nanocavities) with smaller sizes in comparison with those created without a temperature effect at 80 mm/s. In order to obtain satisfactory mechanical properties (Mohs hardness ≥7), the process of the invention recommends mean sizes for nanocavities which do not exceed 15 nm in a treatment depth of between 5 and 70 nm. By reducing the size of the pores, the surface area of the walls of the pores is increased and the mechanical characteristics of the implanted sapphire are improved.

Without wishing to be committed to any one scientific theory, it may be thought that, on the basis of the preceding Example 1, for a rate of displacement VD of 8 cm/s (the heating is not sufficient due to the high rate of displacement VD), the gaps and the interstices brought about by the implantation virtually do not move during the treatment but end up percolating and then collapsing in the form of large nanocavities with a mean size of 20 nm as soon as an atomic concentration threshold of implanted ions, estimated around 5%, (percolation threshold) is exceeded.

If the rate of displacement $V_D$ is reduced to 1 cm/s (under the conditions of the process of the invention, see Example 2), a local heating sufficient to promote the mobility and the encounters of the gaps, the displacement of the gas ions implanted as interstitial, well before reaching the percolation threshold estimated at 5%, is created. The gaps meet to create dislocations which in their turn are converted into a multitude of very well dispersed nanocavities, in their turn trapping the implanted gas ions.

If the rate of displacement $V_D$ is reduced even more, for example to below 1 mm/s, the thermal effect becomes very strong, a deterioration in the reflectance (Y>9%) relating to the diffusion of the implanted entities, the reduction in the size of the nanocavities, indeed even their disappearance, is witnessed.

The process of the invention consists of a precise adjustment, in dose and in rate of displacement $V_D$, in order to reconcile the two facets of the problem: acceptable optical properties (Y≤9%) and necessary mechanical properties (Mohs hardness≥7). The operating conditions of the invention are expressed by the production, in the treated thickness of a region, of nanocavities for which the mean size is less than 15 nm.

FIG. 1 diagrammatically shows the structure of an AR treatment obtained according to the process of the invention, starting from the surface in the direction of the depth:
- a compact layer (1) with a thickness of between 5 and 10 nm;
- a porous amorphous layer (2) with a thickness of between 50 and 60 nm, with a porosity of between 10% and 60%, with pores (nanocavities) with a mean size:
  - of greater than or equal to 15 nm when Mohs hardness<7;
  - of less than 15 nm, preferably of between 3 and 15 nm, more preferably between 8 and 12 nm, when Mohs hardness≤7;
- a pore-free amorphous layer (3) with a thickness of between 20 and 30 nm;
- a layer having altered crystallinity (4) with a thickness of between 50 and 60 nm;
- unaltered sapphire beyond a depth located between 125 and 160 nm.

The mean size of the nanocavities of the porous amorphous layer is:
- greater than or equal to 15 nm when Mohs hardness<7;
- less than 15 nm when Mohs hardness≥7; preferably of between 1 and 15 nm, more preferably of between 5 and 10 nm.

For a dose of nitrogen ions of between 0.5 and $1\times10^{17}$ ions/cm$^2$, the process of the invention makes it possible to create local and transitory thermal conditions which make it possible to initiate, before the percolation threshold (located around 5%), nanocavities with a mean size (<15 nm) which are very well dispersed, guaranteeing good mechanical properties (Mohs hardness≥7) and a high transmittance (Y≤9%).

The invention claimed is:

1. A process for antireflective treatment in the visible region of a material made of sapphire, comprising:
   a preliminary stage comprising bombarding the material with a preliminary stage beam of a mixture of mono- and multicharged ions of gas and adjusting a rate of displacement VD within a range between 0.025x(P/D) to 0.1x(P/D), where P is a power of the preliminary stage beam expressed in watts (W) and D is a diameter of the preliminary stage beam expressed in centimeters (cm), wherein during the preliminary stage:
   the rate of displacement VD is adjusted while keeping an implanted dose and an acceleration voltage constant,
   the acceleration voltage is within a range between 10 and 100 kV, and
   the implanted dose of ions is within a range between $10^{16}$ and $3\times10^{17}$ ions/cm$^2$; and
   a treatment stage comprising bombarding the material with a treatment stage beam of a mixture of mono- and multicharged ions of a gas which are produced by an electron cyclotron resonance (ECR) source, wherein during the treatment stage:
   an acceleration voltage is within a range of between 10 and 100 kV,
   an implanted dose of ions, expressed in ions/cm$^2$, is within a range of between $10^{16}$ and $3\times10^{17}$ ions/cm$^2$, and
   a rate of displacement $V_D$, expressed in cm/s, is within a range of between 0.1 cm/s and 5 cm/s.

2. The process according to claim 1, wherein the mixture of mono- and multicharged ions of the preliminary stage beam and/or the treatment stage beam are ions of the elements selected from the group consisting of helium (He), neon (Ne), argon (Ar), krypton (Kr), and xenon (Xe).

3. The process according to claim 1, wherein the mixture mono- and multicharged ions of the preliminary stage beam and/or the treatment stage beam are ions of gases selected from the group consisting of nitrogen (N$_2$) and oxygen (O$_2$).

4. The process according to claim 1, wherein the implanted dose during the treatment stage, expressed in ions/cm$^2$, is between $(5\times10^{16})\times(M/14)^{-1/2}$ and $10^{17}\times(M/14)^{-1/2}$, where M is the atomic mass of the ion.

5. The process according to claim 1, wherein the rate of displacement $V_D$ during the treatment stage, expressed in cm/s, is between 0.025×(P/D) and 0.1×(P/D), where P is the power of the beam, expressed in W (watts), and D is the diameter of the beam, expressed in cm (centimeters).

6. The process according to claim 1, comprising selecting a displacement amplitude A of the treatment stage beam, expressed in cm, so that (P/A$^2$)>0.04 W/cm$^2$, where P is the power of the beam, expressed in W (watts).

7. The process according to claim 1, wherein the treatment stage beam of the mixture of mono- and multicharged ions of the gas comprises 10% of multicharged ions or more than 10% of multicharged ions.

8. The process according to claim 1, comprising selecting the dose of mono- and multicharged ions of the gas which are implanted per unit of surface area during the treatment stage to achieve an atomic concentration of implanted ions of greater than or equal to 5%.

9. The process according to claim 1, comprising selecting the rate of displacement $V_D$ during the treatment stage is to obtain, in a treated thickness, nanocavities having a mean size that does not exceed 15 nm in a depth of between 5 and 70 nm.

10. The process according to claim 1, comprising displacing the material made of sapphire under the treatment stage beam of a mixture of mono- and multicharged ions of a gas a plurality N of passes at the rate of displacement $V_D$.

11. A part made of sapphire comprising at least one antireflective surface made by the process according to claim 1, characterized in that a reflectance Y of just one treated face is less than or equal to 9% for a wavelength of 530 nm and in that a Mohs hardness is greater than or equal to 7 on the Mohs scale.

12. A part made of sapphire comprising at least one antireflective surface made by the process according to claim 1, characterized in that the mean size of nanocavities created in a depth of between 5 and 70 nm does not exceed 15 nm.

13. The process of claim 1, wherein the material is a part made of sapphire selected from the group consisting of a touch screen, a watch glass, or a lens of an optical device.

14. A part made of sapphire comprising, starting from the surface in the direction of the depth:
   a compact layer with a thickness of between 5 and 10 nm;
   a porous amorphous layer with a porosity of between 10% and 60%, with a thickness of between 50 and 60 nm, with nanocavities having a mean size of less than 15 nm.

15. The part of claim 14, wherein the part is selected from the group consisting of a touch screen, a watch, and a lens of an optical device.

16. A process for antireflective treatment in the visible range of a material made of sapphire, comprising:
   bombarding the material with a beam of a mixture of mono- and multicharged ions of a gas which are produced by an electron cyclotron resonance (ECR) source, where:
   an acceleration voltage is within a range of between 10 and 100 kV;
   an implanted dose of ions, expressed in ions/cm$^2$, is within a range of between $10^{16}$ and $3 \times 10^{17}$ ions/cm$^2$;
   a rate of displacement VD, expressed in cm/s, is within a range of between 0.1 cm/s and 5 cm/s; and
   a displacement amplitude A of the beam, expressed in cm, is chosen so that $(P/A^2) > 0.04$ W/cm$^2$, where P is the power of the beam, expressed in W (watts).

* * * * *